US008747554B2

(12) United States Patent
Morikawa et al.

(10) Patent No.: US 8,747,554 B2
(45) Date of Patent: Jun. 10, 2014

(54) MULTI-PIECE CERAMIC CRUCIBLE AND METHOD FOR MAKING THEREOF

(75) Inventors: Yuji Morikawa, Hyogo (JP); Kazuo Kawasaki, Hyogo (JP); Sun-joong Hwang, Tokyo (JP); Marc Schaepkens, Medina, OH (US)

(73) Assignee: Momentive Performance Materials Inc., Waterford, NY (US)

( * ) Notice: Subject to any disclaimer, the term of this patent is extended or adjusted under 35 U.S.C. 154(b) by 978 days.

(21) Appl. No.: 11/554,561

(22) Filed: Oct. 30, 2006

(65) Prior Publication Data

US 2007/0289526 A1    Dec. 20, 2007

Related U.S. Application Data

(60) Provisional application No. 60/805,238, filed on Jun. 20, 2006.

(51) Int. Cl.
*F27B 14/00* (2006.01)
*C30B 35/00* (2006.01)
*C30B 15/00* (2006.01)
*B22D 7/00* (2006.01)
*B22D 33/00* (2006.01)

(52) U.S. Cl.
CPC ............ *C30B 15/00* (2013.01); *C30B 35/00* (2013.01); *B22D 7/00* (2013.01); *B22D 33/00* (2013.01); *Y10S 117/90* (2013.01)
USPC ............ 117/200; 117/900; 118/715; 427/469

(58) Field of Classification Search
USPC ......... 117/200, 900; 118/715; 427/255.1, 469
See application file for complete search history.

(56) References Cited

U.S. PATENT DOCUMENTS

| | | | | |
|---|---|---|---|---|
| 2,842,353 | A * | 7/1958 | Priola | 266/275 |
| 3,986,822 | A | 10/1976 | Lashway | 432/264 |
| 4,856,457 | A * | 8/1989 | Knauer | 118/666 |
| 4,946,542 | A * | 8/1990 | Clemans | 117/83 |
| 5,158,750 | A * | 10/1992 | Finicle | 422/547 |
| 5,253,266 | A * | 10/1993 | Knodle et al. | 373/10 |
| 5,482,257 | A * | 1/1996 | Holcombe et al. | 266/275 |
| 5,759,646 | A * | 6/1998 | Kano et al. | 428/34.4 |
| 5,827,371 | A * | 10/1998 | Colombo et al. | 118/726 |
| 5,932,294 | A | 8/1999 | Colombo | 427/469 |
| 6,835,910 | B2 * | 12/2004 | Moore et al. | 219/121.45 |
| 2001/0010203 | A1 * | 8/2001 | Nakabayashi et al. | 117/200 |
| 2007/0209580 | A1 * | 9/2007 | Kondo et al. | 117/204 |
| 2007/0289526 | A1 * | 12/2007 | Morikawa et al. | 117/88 |
| 2008/0127885 | A1 * | 6/2008 | Hagi | 117/209 |

FOREIGN PATENT DOCUMENTS

JP    05044020 A  *  2/1993  ............. C23C 14/24

OTHER PUBLICATIONS

AIPN, English Computer translation of JP 05-044020 (1993).*

* cited by examiner

*Primary Examiner* — Matthew Song
(74) *Attorney, Agent, or Firm* — Joseph E. Waters

(57) ABSTRACT

A unibody, multi-piece crucible for use in for use in elemental purification, compounding, and growth of semi-conductor crystals, e.g., in the process of molecular beam epitaxy (MBE) for melting silicon and the like at high temperature. The crucible has an outer coating layer that fixedly joins the multi pieces making up the crucible. The invention also provides a method for making a unibody containing structure comprising pyrolytic boron nitride having a negative draft, which method obviates the need of complicated overhang structure of graphite mandrels or the removal of the graphite mandrels by burning at high temperatures.

21 Claims, 2 Drawing Sheets

FIG. 1A
FIG. 1B
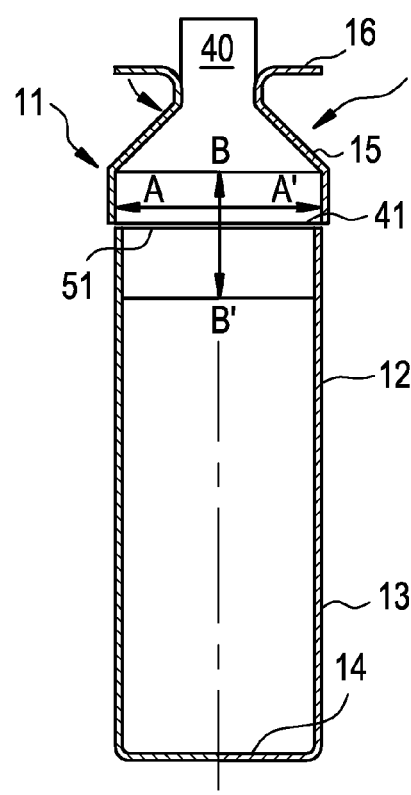
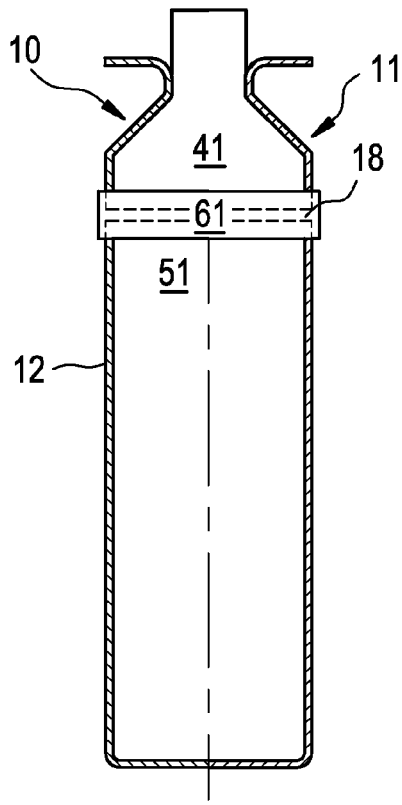
FIG. 2A FIG. 2B FIG. 3
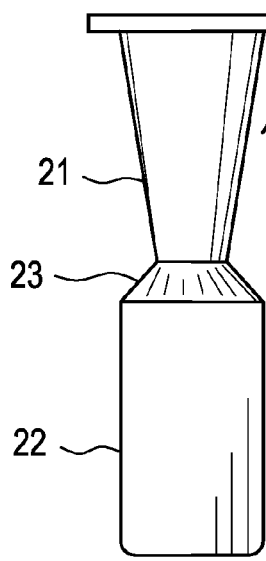
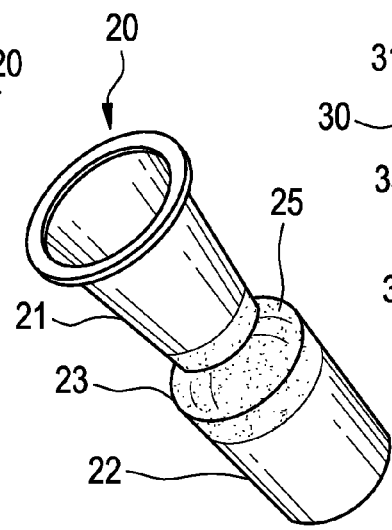
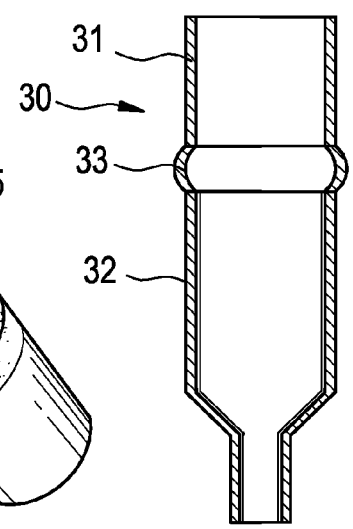

MULTI-PIECE CERAMIC CRUCIBLE AND METHOD FOR MAKING THEREOF

CROSS-REFERENCE TO RELATED APPLICATIONS

This application claims the benefits of U.S. 60/805,238 filed Jun. 20, 2006, which patent application is fully incorporated herein by reference.

FIELD OF THE INVENTION

The present invention relates to a crucible for use in elemental purification, compounding, and growth of semiconductor crystals, e.g., molecular beam epitaxy (MBE) effusion cell or source, more particularly, a crucible comprising a plurality of pieces forming a unibody. The invention also provides a method and apparatus for the manufacture of the crucible.

BACKGROUND OF THE INVENTION

The structure, physical properties, purity, and chemical inertness of ceramic materials such as pyrolytic boron nitride (pBN) make attractive container materials for elemental purification, compounding, and growth of semi-conductor crystals. Depending on the application and desired crucible capacity, crucibles may have a straight wall cylindrical configuration as disclosed in U.S. Pat. No. 5,158,750; a straight but tapered wall configuration as disclosed in U.S. Pat. No. 5,759,646; stepped or indented portion in its straight wall as disclosed in U.S. Pat. No. 4,946,542; or a negative draft crucible for MBE effusion cells as disclosed in U.S. Pat. No. 5,932,294 for a one-piece crucible with a narrow neck between a base section and a conical top section.

PBN crucibles are made using processes known in the art, i.e., by first preparing a mandrel having the desired shape of the crucible; depositing boron nitride upon the mandrel until the desired thickness of boron nitride is obtained; and lastly, removing the boron nitride crucible from the mandrel. Graphite is typically used as the material for the mandrel. For crucibles having a straight or tapered wall (larger top than bottom) and as graphite shrinks at a higher rate than pBN due to its thermal contraction coefficient, the graphite mandrel can slip off with relative ease to allow the removal of the pBN crucible from the mandrel. However, for crucibles with indented or curved portions, e.g., a neck in the crucible wall, it is necessary to design special mandrels with that fracture into pieces as disclosed in U.S. Pat. No. 5,827,371 to remove the top portion of the mandrel. With respect to the bottom part, an additional process step of heating the crucible to 300-750° C. for 40 hours to oxidize the bottom portion of the mandrel, thus destroying the graphite mandrel bottom part and yielding a unibody, monolithic pBN crucible.

The invention relates to a ceramic crucible comprising a plurality of pieces, forming a unibody, and a method for making a unibody crucible from a plurality of pieces without the need for a heating step to destroy and remove the complex graphite mandrel from the crucible.

SUMMARY OF THE INVENTION

A unibody boron nitride crucible, which can be used in molecular beam epitaxy (MBE) effusion cell applications, has been developed. The crucible is made up of at least two parts that are joined together around their circumferences, and the joint is hermetically sealed by at least a coating layer comprising pyrolytic boron nitride or pyrolytic graphite. In one embodiment, the coating layer is patterned forming a predetermined geometry, the layer is provided with at least two separate ends adapted for forming at least an electrode for receiving DC or AC current to heat the crucible.

The invention further relates to a method for the preparation of a unibody crucible, comprising the steps of: a) depositing pyrolytic boron nitride (pBN) onto the surface of at least two different mandrels to form at least two parts of the crucible; b) removing the mandrels from the pBN parts; c) joining the parts together around the circumference forming a unibody crucible; and d) depositing a coating layer comprising pyrolytic boron nitride or pyrolytic graphite onto the joint surface to hermetically seal the joint between the two parts.

BRIEF DESCRIPTION OF THE DRAWINGS

FIG. 1A is cross-sectional view of an embodiment of a multi-piece crucible in accordance with the present invention, with a top portion and a bottom portion.

FIG. 1B is a cross-sectional view of a second embodiment of a multi-piece crucible in accordance with the present invention, with 3 pieces top, bottom, and middle piece for the joint between the top and bottom portions, forming a unibody.

FIG. 2A is a cross-sectional view of a second embodiment of a multi-piece crucible of the invention.

FIG. 2B is a perspective view of the multi-piece crucible of FIG. 2A.

FIG. 3 is a cross-sectional view of another embodiment of a multi-piece crucible of the invention.

DESCRIPTION OF THE INVENTION

Figure 4:
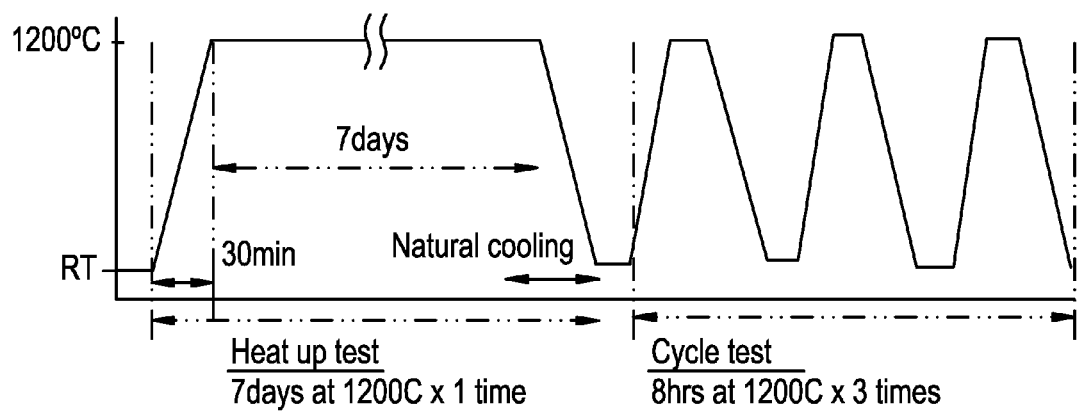
FIG. 4 is a diagram showing the heating cycle of one embodiment of the crucible while it was charged with molten aluminum.

As used herein, approximating language may be applied to modify any quantitative representation that may vary without resulting in a change in the basic function to which it is related. Accordingly, a value modified by a term or terms, such as "about" and "substantially," may not to be limited to the precise value specified in some cases.

As used herein, the term "crucible" may be used interchangeably with "vessel," or a "container" for use in elemental purification, compounding, growth of semi-conductor crystals, and deposition of metals and dopants by molecular beam epitaxy (MBE). The term "multi-piece" may be used interchangeably with "multi-part" or "multiple part" to refer to the multiple pieces that make up the unibody (or one piece, a single body) crucible of the invention.

Embodiments of the crucibles of the invention are illustrated as follows, by way of a description of the manufacturing process thereof and with references to the figures.

Embodiments of the Crucibles: FIG. 1A illustrates one embodiment of a crucible 10 of the invention which comprises 2 separate pieces. The first piece is a base section 12 with a substantially cylindrical configuration with a sidewall 13, a close-end bottom 14 disposed at one end of the sidewall 13, and an open top with a circumference 51. The second piece is a top section 11 with an open bottom with a circumference 41, an open top or orifice with circumference 40 having a negative draft tapered wall 15 with the top of the tapered wall connected to an annular lip 16 extending outwardly. In one embodiment, the tapered wall 15 forms an angle of 45° C. with the outwardly extending annular lip 16.

In one embodiment, the circumferences 41 and 51 of the top and bottom sections respectively are of slightly different diameters or sizes such that the two sections overlap each other around their circumferences, i.e., the top section with circumference 41 overlaps the bottom section with circumference 51 up to line A-A' in the Figure. In another embodiment (not shown), the reverse occurs for the top bottom to be disposed within the bottom section, i.e., the bottom section overlaps the top bottom. In yet another embodiment (not shown) the two top and bottom sections are approximately equal in size or diameter such that the top and bottom sections abut each other around the circumference.

In order to form a single-piece unibody crucible, an overcoat layer comprising pyrolytic graphite or pyrolytic boron nitride is formed over the overlapping (or abutting) top and bottom sections for a hermetic seal, covering any gap or opening in the connection and further providing support and structural integrity to the crucible. In one embodiment of the invention, the overcoat layer (as defined by the gray area in FIG. 1A) covers only a section of the crucible body for a partial length of the crucible (as defined by line B-B').

In one embodiment as illustrated in FIG. 1B, the top and bottom sections are of approximately the same circumferences and positioned abut each other around the circumference 41 and 51. The crucible, however, further comprises a third section 18 having a circumference 61 that is slighter larger in size than the top and bottom circumferences to overlap both bottom and top sections 11 and 12. The midsection 18 provides support and structural integrity in connecting the top and bottom sections. An overcoat layer (not shown) covers any gap or opening between the overlapping or abutting sections.

As illustrated in FIGS. 1A-1B, the sections 11, 12, and 18 have a predetermined substantially uniform circumference along the vertical axis of each respective section. In one embodiment (not shown), the circumference at the orifice to be in connection with the other section(s) via abutting or overlapping may be slightly smaller or larger than the circumference of the rest of the section, allowing the section to be overlapping or being positioned within the circumference of the other section(s). In one embodiment as illustrated in FIG. 1A, the crucible section defined by circumference 41 and line AA' has a thinner wall than the rest of the section 11, for the section to have a larger diameter portion around the inner surface of the section 11. This larger diameter allows circumference 41 to overlap circumference 51, forming a lip or an overlapping section up to line AA'.

In another embodiment of a unibody crucible 20 as illustrated in FIGS. 2A and 2B, the crucible comprises three sections that are connected to one another forming a unibody. The base section 22 has a substantially cylindrical configuration with a sidewall and a bottom disposed at one end of the sidewall. The middle section 23 is of a partial conical shape, forming a negative draft tapered wall or neck of an angle approximately 45.0 degrees with respect to the vertical axis. The conical top section 21 comprises a positive draft wall and an annular lip. In one embodiment, the wall tapers outwardly (laterally) away from the vertical axis at an approximate angle of 8-15 degrees. In one embodiment as illustrated in FIG. 2A, the annular lip extends outwardly at a right angle.

In one embodiment as illustrated in FIG. 2B, the crucible 20 is provided with a partial overcoat layer 25 to cover any gaps/opening between the joints of the sections 21, 22, and 23. The partial overcoat layer also provides structural support/integrity to the crucible. In another embodiment of the invention (not shown), the outside of crucible 20 is entirely coated with an overcoat layer comprising a material the same or different to the material of construction of the crucible 20.

FIG. 3 illustrates a crucible 30 that can be used in growing large single crystals of Group III-V or Group II-VI semiconductor compounds. The multi-part crucible (in the final unibody form) comprises a larger diameter portion around the inner surface of the crucible at or near the top 31 of the single crystal being grown. The larger diameter portion in one embodiment is an annular "bulge" section 33. In operation when the molten semiconductor material freezes, the bulge 33 of the frozen semiconductor crystal prevents molten encapsulant material from flowing between the semiconductor crystal and the crucible. To form a unibody crucible 30 as shown, the bulge section 33 connects the top section 31 and the bottom section 31, and an overcoat layer (not shown) entirely covers the crucible outer surface or partially covers the surface of the crucible and around the connections of sections 31, 32, and 32. The overcoat layer seals any gap between the multi sections and providing structural integrity to the crucible.

In the following, the multi-piece crucible of the invention is described in more detail by way of embodiments to manufacture the crucible and examples.

Crucible Method of Manufacture: In one embodiment and in the first step, the crucible parts described above are constructed by chemical vapor deposition (CVD) with pyrolytic boron nitride (pBN) being the material for construction. This method may, however, also be used in conjunction with other chemicals construct the crucible parts with other materials by chemical vapor deposition.

To construct the crucible parts, the boron nitride is deposited upon a mandrel having the same shape as the desired crucible part. In one embodiment, the mandrel employed is made of graphite so that it does not melt at the temperature at which the boron nitride is applied and which is inert to the boron halide and ammonia at such temperature. The mandrel is first mounted in a vapor deposition vacuum furnace/chamber. Multiple mandrels can be placed into the furnace at the same time for forming the various parts of the crucible. After the furnace is heated to the desired temperature, ammonia and boron halide gas, e.g., boron trichloride, are introduced into the reactor. The reaction between the ammonia and boron halide, and deposition of the boron nitride produced by this reaction, is typically effected at a temperature of from about 1450-2300° C. and a submillimeter pressure, and the reactor is accordingly maintained within this range. In one embodiment, the temperature of the reactor is maintained between about 1800-2000° C. In yet another embodiment, the temperature of the reactor is maintained at 1900° C.

In the next step, the reactants are introduced into the reactor in vapor phase. In one embodiment, at least 1 mole of ammonia is employed per mole of boron halide. In a second embodiment, from 2.5 to 3.5 moles of ammonia are employed per mole of boron halide. The flow rate of the reactants through the reactor depends upon the specific design of the reactor and the size and shape of the mandrel upon which the boron nitride is to be deposited. In one embodiment, the rate is set at 0.2-0.3 cm$^3$/hour of boron halide per 1.5-2.5 cm$^3$ of furnace volume. In a second embodiment, an inert gas is mixed with the reactant gases to obtain the desired rate.

In one embodiment, crucible parts comprising multi-layers of pBN as described in U.S. Pat. No. 3,986,822 are formed. Specifically, the crucible part is produced by first depositing pBN upon a mandrel having the shape of the desired crucible part at a temperature of from about 1850-2300° C. until a first layer of boron nitride of suitable thickness has been produced. The deposition of boron nitride on the mandrel is interrupted and the temperature is lowered to below 1750° C., then an additional layer of BN is deposited at a temperature of from about 1850-2300° C. to produce a second outer layer of boron nitride having a thickness greater than that of the first inner layer.

The thickness of the crucible part will vary somewhat depending upon the size of the desired final crucible. In one embodiment, the BN crucible wall has a thickness between 0.03 cm to 0.23 cm thick. In a second embodiment, the BN crucible wall has a thickness between 0.05-0.076 cm. thick for crucibles having an inner diameter of from 2.5-7.6 cm. In a third embodiment, the BN crucible wall has a thickness between 0.05 cm to 0.15 cm thick. For multi-layer or multi-wall crucibles, in one embodiment, the thickness of the inner wall of the crucible is about 50-75% of the thickness of the outer wall.

After a suitable time, i.e., after the desired amount/thickness of boron nitride has been deposited on the mandrel, the flow of reactants into the reactor is interrupted and the reactor is cooled to room temperature. The pBN parts can then be removed from the mandrel. If necessary, the part can be cut to a desired length and cleaned. In one embodiment, the circumference (or lip) portion of the crucible part (to be interconnected with the circumference of another crucible section) is roughened by a suitable method such as sandblasting and the like for a roughened surface prior to be disposed within or abut to the circumference of the other part of the crucible.

After the crucible parts are formed/finished, they are assembled together forming a crucible. In one embodiment of a multi-part crucible, the top section is positioned abut the second bottom section forming a tight joint. In a second embodiment, the top section is disposed inside the bottom section for an overlapping length or lip of 0.25 to 1 cm. In a third embodiment, the top section is disposed outside the bottom section, overlapping the bottom section for a length of 0.25 to 1 cm.

In one embodiment, the overlapping is snug or tight with an average gap of less than 0.254 cm between and in the joints of the two circumferences 41 and 51. In a second embodiment, the average gap between the two sections is less than 0.0254 cm. In a third embodiment, the average gap between the two circumferences is 0.0051 to 0.0102 cm. In a fourth embodiment, the average gap between the overlapping sections is less than 0.005 cm.

After the parts of the crucible are joined forming a "single" crucible, the crucible assembly is placed in a vapor deposition vacuum furnace/chamber for a coating layer on the outer surface of the crucible. The coating layer is to cover the gap/connection/between the parts for a hermetic seal, thus fixedly joining the parts. As used herein, a "hermetic seal" means that there is no visual leak/failure in the joint of the parts of the crucible after the crucible is exposed to a molten metal for a continuous period of at least 8 hours.

In one embodiment, the crucible is coated with at least a coating layer comprising a carbonaceous material, a refractory metal, or a ceramic material such as pyrolytic boron nitride, pyrolytic graphite, silicon carbide, platinum, and the like. The selection of the coating layer covering the multi-part connection(s) depends on the final application of the crucible. Although gallium and arsenic have no reactivity with PBN per se, silicon may be converted into a nitride in the vapor-deposited film when the vapor deposition is performed by melting silicon in a crucible. In one embodiment, the coating is an inert material having little or no reactivity with a melt of materials such as silicon as used in the molecular beam epitaxy operations, e.g., pyrolytic boron nitride or graphite.

In one embodiment, the coating layer is an overcoat covering the entire outside surface of the crucible. In another embodiment, the overcoat layer covers the connection part between the separate crucible parts, for a length of less than ⅛ of the crucible length. In a second embodiment, the overcoat layer covers the connection of the sections and additionally on both sides of the connection for up to ¼ of the crucible length. In a third embodiment, the overcoat layer covers the entire crucible outer surface, for the crucible to have the appearance of a one-piece unibody. In a fourth embodiment, the overcoat layer covers at least 10% of the external surface of the crucible, including the joint connection. In a fifth embodiment, the overcoat layer covers at least 25% of the external surface of the crucible.

In one embodiment, the coating layer has a thickness of 0.005 mm to 0.025 mm. In a second embodiment, it has a thickness of 0.015 mm to 0.020 mm.

In one embodiment, a partial or full coating layer comprising graphite is provided on the outer surface of the crucible body. Pyrolytic graphite ("PG") can be formed by conducting a pyrolytic reaction of a gaseous hydrocarbon compound so as to deposit the pyrolytic graphite on the surface of the crucible. In one embodiment, a PG coating is formed by first subjecting the crucible to a sandblasting treatment on the whole surface (or the surface to be coated) thereof so as to impart the surface with an average surface roughness of 2 μm. A protective coating layer of pyrolytic graphite (PG) having a thickness of 0.005 mm to 0.025 mm is next formed on the thus roughened surface of the PBN base body by conducting the pyrolytic reaction of methane at a temperature of 1650° C. under a pressure of 5 Torr. The PG coating protects the surface of the crucible and fill/cover any gap between the interconnecting crucible parts.

In one embodiment, the pG coating can be used as a RF current receiving coating, thus allowing the crucible to be heated. In yet another embodiment, at least a portion of the pyrolytic graphite coating layer (outside the joint area) is patterned into the shape of at least a heater pattern, e.g., spiral, serpentine geometry, helical, zigzag, continuous labyrinthine, spirally coiled pattern, swirled, randomly, or combinations so as to form a resistance heating element or an electrical flow path in the form of an elongated continuous strip of pyrolytic graphite having opposite ends, allowing DC or AC current to be sent through the heater pattern to heat the crucible. In one embodiment, the pG coating layer helps facilitate the coating of the crucible up to 20% faster than a crucible without a pG coating layer.

In yet another embodiment, in place of or in addition to an overcoat (or partial coating) layer to cover the interconnect between the parts for a hermetic or tight seal, the crucible is provided with a layer coating at least partially the inner surface of the crucible and providing a hermetic seal to the joint of the crucible parts. In one embodiment, the inner coating layer is provided in addition to an outer coating layer of pyrolytic graphite. In another embodiment, the inner coating layer (thus, the undercoating to the pBN crucible wall) is provided at the top section of the crucible, extending from the lip downward, covering anywhere from 10 to 80% of the length of the crucible.

Applications of the Multi-Piece Crucible of the Invention: After assembly forming a unibody crucible with an overcoat (or partial overcoat) layer, the crucible can be used in any and all applications suitable for the one-piece crucible of the prior art. Examples include containers for liquid-encapsulated Czochralski (LEC) and vertical gradient freeze (VGF) growth of GaAs and other III-V and II-VI compound single crystals, and source containers for deposition of metals and dopants at high temperatures and ultra-high vacuum by molecular beam epitaxy (MBE). Molecular beam epitaxy equipment is essentially a vacuum furnace in which semi-conductor substrates are coated with epitaxial layers of a variety of elements or compounds of aluminum, gallium, arsenic, indium and the like, by vaporization of these elements or compounds contained in a ceramic crucible.

In one embodiment of a unibody crucible having a negative draft portion, the crucible is used as an effusion cell crucible for MBE.

EXAMPLE

Examples are provided herein to illustrate the invention but are not intended to limit the scope of the invention.

Example 1

Pyrolytic process is conducted in a CVD chamber with a 3:1 by volume gaseous mixture of ammonia and boron trifluoride in the presence of core molds forming the top and bottom sections of a crucible. The CVD process is conducted at a temperature of 1900° C. under a pressure of 2 Torr to form a PBN layer having a thickness of 1 mm on the surface of the core molds. The molds are removed to form 2 crucible parts as illustrated in FIG. 1A, of a top and bottom sections. The top section is disposed on top of the bottom section, forming a unibody. The assembled crucible next is coated with a pyrolytic graphite layer having a thickness of 0.50 mm to cover the joint between the two pBN parts.

The thus obtained surface-sealed PBN crucible is subjected to a test use as a vessel charged with aluminum up to 30% of the crucible volume. In the test, the temperature of the crucible is ramped up to 1200° C. to prevent the overflowing/creep of aluminum (Al) in liquid form to the top of crucible and thus contaminating the MBE reaction chamber. This temperature is lower than the normal operating temperature for many Al evaporation applications, which is typically at 1450° C. FIG. 4 is a schematic diagram showing the heating cycle that the crucible of the invention is subject to. No leakage of Al is observed through the joint area for the duration of the experiment/heating cycle.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A crucible for making crystals of a semiconductor material, the crucible comprising:
   a closed end, an open end, a length extending from the open end to the close end;
   a circumference in-between the length extending from the open end to the close end; and
   an internal surface and an external surface, wherein the crucible comprises:
   at least two parts, a base part and a top part, that are joined together at the circumference forming a joint, wherein the at least two parts are made of a material which is inert, corrosion resistant, and heat stable in a process for making crystals of a semiconductor material; and
   the crucible is provided with a pyrolytic boron nitride coating layer contacting at least a portion of the internal surface or a portion of the external surface, wherein the coating layer fixedly joins the parts by hermetically sealing the joint.

2. The crucible of claim 1, wherein each of the at least two parts is of equal circumference for the two parts to abut each other at the joint.

3. The crucible of claim 1, wherein each of the at least two parts is of different circumference for the two parts to overlap each other at the joint.

4. The crucible of claim 1, wherein the crucible is provided with a coating layer having a thickness of 0.005 mm to 0.025 mm to hermetically sealing the joint between the at least two parts.

5. The crucible of claim 4, wherein the coating layer coats the entire external surface of the crucible.

6. The crucible of claim 4, wherein the coating layer coats the joint between the at least two parts of the crucible and at least part of the external surface of the crucible.

7. The crucible of claim 1, wherein the at least two parts are made of pyrolytic boron nitride.

8. The crucible of claim 1, wherein the base part is substantially cylindrical in shape, and the top part is substantially conical in shape.

9. The crucible of claim 1, wherein crucible has a substantially uniform wall thickness between 0.03 cm to 0.23 cm thick.

10. The crucible of claim 1, wherein the crucible further comprises a pyrolytic graphite coating on at least a portion of the external or internal surface of the crucible.

11. The crucible of claim 10, wherein the crucible further comprises a continuous surface coating of pyrolytic graphite, wherein the coating of pyrolytic graphite receives an RF signal and heats the crucible up to a temperature of at least 1450° C. in at least 10% less time than a crucible without the pyrolytic graphite coating layer.

12. The crucible of claim 10, wherein the coating of pyrolytic graphite is patterned forming a predetermined geometry, the coating of pyrolytic graphite is provided with at least two separate ends adapted for forming at least an electrode for receiving DC or AC current to heat the crucible.

13. A crucible for making crystals of a semiconductor material, the crucible comprising:
   a closed end, an open end, a length extending from the open end to the close end;
   a circumference in-between the length extending from the open end to the close end; and
   an internal surface and an external surface, wherein the crucible comprises:
   at least two distinct and separate parts, a base part and a top part, that are subsequently joined together at the circumference forming a joint, wherein the at least two parts are made of a material which is inert, corrosion resistant, and heat stable in a process for making crystals of a semiconductor material; and
   the crucible is provided with a pyrolytic boron nitride coating layer contacting at least a portion of the internal surface, wherein the coating layer fixedly joins the at least two distinct and separate parts by hermetically sealing the circumferential joint.

14. The crucible of claim 13, wherein each of the at least two parts is of equal circumference for the two parts to abut each other at the joint.

15. The crucible of claim 13, wherein each of the at least two parts is of different circumference for the two parts to overlap each other at the joint.

16. The crucible of claim 13, wherein the crucible is provided with a coating layer having a thickness of 0.005 mm to 0.025 mm to hermetically sealing the joint between the at least two parts.

17. The crucible of claim 13, wherein the at least two parts are made of pyrolytic boron nitride.

18. The crucible of claim 13, wherein the base part is substantially cylindrical in shape, and the top part is substantially conical in shape.

19. The crucible of claim 13, wherein crucible has a substantially uniform wall thickness between 0.03 cm to 0.23 cm thick.

20. The crucible of claim 13, wherein the crucible further comprises a pyrolytic graphite coating on at least a portion of the external or internal surface of the crucible.

21. The crucible of claim 20, wherein the outer surface of the crucible is coated with pyrolytic graphite, and the pyrolytic graphite coating layer is patterned forming a predetermined geometry, the pyrolytic graphite coating layer is provided with at least two separate ends adapted for forming at least an electrode for receiving DC or AC current to heat the crucible.

\* \* \* \* \*